United States Patent [19]

Masuda

[11] 4,074,238

[45] Feb. 14, 1978

[54] SEMICONDUCTOR READ-ONLY MEMORY

[75] Inventor: Kenzo Masuda, Tokorozawa, Japan

[73] Assignee: Hitachi, Ltd., Japan

[21] Appl. No.: 666,426

[22] Filed: Mar. 12, 1976

[30] Foreign Application Priority Data

Mar. 26, 1975 Japan .................................. 50-35598

[51] Int. Cl.² ........................ G11C 11/40; G11C 13/00
[52] U.S. Cl. ................................................. 365/104
[58] Field of Search .................... 340/173 R; 307/238, 307/279

[56] References Cited

U.S. PATENT DOCUMENTS

| 3,846,768 | 11/1974 | Krick | 340/173 R |
| 3,949,382 | 4/1976 | Yasui | 340/173 R |
| 3,953,839 | 4/1976 | Denninson et al. | 340/173 R |

Primary Examiner—Vincent P. Canney
Attorney, Agent, or Firm—Craig & Antonelli

[57] ABSTRACT

A read-only memory of lateral type comprising a plurality of information memory circuits connected in parallel with one another across a first line and a second line. In each of the information memory circuits, a first insulated-gate field effect transistor of either the depletion mode or the enhancement mode, selected depending on the information to be stored, is connected in series with a second insulated-gate field effect transistor of enhancement mode. The read-only memory further comprises reading means for reading the mode of the first insulated-gate field effect transistor in each information memory circuits, so that an output signal according to the mode of the first insulated-gate field effect transistor can be read out from the memory by the reading means.

8 Claims, 10 Drawing Figures

SEMICONDUCTOR READ-ONLY MEMORY

BACKGROUND OF THE INVENTION

1. Field of the Invention

This invention relates to a logic circuit device using insulated-gate field effect transistors (referred to hereinafter as MISFET's), and more particularly to a semiconductor read-only memory (referred to hereinafter as a ROM) comprising a plurality of MISFET's connected in parallel with a single output line.

2. Description of the Prior Art

A mask programmable ROM comprising MISFET's is commonly known in the art. This ROM is of the so-called lateral type in which a plurality of MISFET's are connected in parallel with one another across a single output line and a reference potential source. In the ROM of this lateral type, an active MISFET is disposed in a predetermined memory cell position when it is desired to store, for example, a binary signal "1" in this specific memory cell position, while an MISFET having a thick gate insulating oxide film and not making any transistor action is disposed in such a specific memory cell position when conversely it is desired to store a binary signal "0" in such memory cell position. In the known ROM of the lateral type, active MISFET's can be selectively disposed in any desired memory cell positions using a suitable photo-etching mask during formation of the MISFET's including the active MISFET's. It will thus be seen that, in the known ROM of the lateral type, the pattern of a photo-etching mask used generally for the manufacture of a semiconductor device is suitably modified so that desired information can be written in the memory cells of the ROM according to a predetermined program instructing the storage of the information, and the photo-etching mask is used for changing the relative thickness of the gate insulating oxide film of the MISFET's.

The present inventor has investigated a ROM of a serial type previously proposed in the company to which he belongs. The structure of this serial type ROM is such that a plurality of MISFET's are connected in series with each other across a single output line and a reference potential source. In the proposed ROM of the serial type, a mask is used for selectively providing MISFET's of depletion mode among those connected in series thereby writing desired information. According to this proposal, an MIS ROM having a very high packing density can be obtained, and the yield rate can be greatly improved due to the fact that the ROM can be simply and easily manufactured. Such advantages can be obtained because multi-layer wiring of aluminum is unnecessary due to the fact that MISFET's of depletion mode and those of enhancement mode are arranged in matrix in this MIS ROM of the serial type. Further, such multi-layer wiring is also unnecessary even in the area in which the source or drain regions cross the polycrystalline silicon layers providing the gates. Furthermore, due to the fact that the drain region of each individual MISFET can be formed for use in common to the source region of the adjacent MISFET's, the drain regions of all the MISFET's need not be connected to an earth line unlike prior art MIS ROM's, and it is also unnecessary to provide contact holes for electrical connection to multi-layer wiring of aluminum.

The ROM of this serial type must be of ratioless structure in order that the memory is a capable of delivering a power source level output with a sufficiently large amplitude. However, when this serial ratioless structure is applied to a chip selecting ROM, a register selecting ROM or like ROM of a small capacity associated with a ROM of the serial type, which usually has a large memory capacity, means including a flip-flop circuit are required to receive the output of the ROM, or timing means for controlling the precharging or like timing are required, resulting in a trouble such as undesirable occurrence of a time lag. Therefore, in a ROM having a relatively small capacity, it is desirable to utilize the merit of the serial type while, at the same time, employing the commonly known lateral ratio structure, rather than employing the serial ratioless structure. In such a case, however, it is necessary, for the purpose of writing desired information, to employ two kinds of masks, that is, a mask for forming MISFET's of depletion mode in a ROM of the serial type and another mask for changing the relative thickness of the gate insulating oxide film in a ROM of the lateral type. The necessity for preparation of the two kinds of masks has led to troublesome and complex steps for the manufacture of the ROM of the kind described resulting in an uneconomical increase in the manufacturing cost.

SUMMARY OF THE INVENTION

It is therefore an object of the present invention to provide a novel ROM of the lateral type in which desired information can be written by merely modifying the pattern of a mask for forming MISFET's of depletion mode.

Another object of the present invention is to provide a ROM structure suitable for the simultaneous formation of a ROM of the serial type and a ROM of the lateral type.

Still another object of the present invention is to provide a ROM of a small capacity in which desired information can be written by suitably modifying the pattern of a mask used for locally selectively forming MISFET's of depletion mode and which can be produced simultaneously with the formation of a ROM of the serial ratioless structure, so that the cost required for the information writing can be considerably reduced.

According to a basic structure of the ROM of the present invention, one MISFET of enhancement mode or depletion mode is connected in series with each of a plurality of MISFET's of enhancement mode connected in parallel with one another across a single output line or voltage supply line and a reference potential source. When it is desired to write information in predetermined cells among those provided by the parallel-connected MISFET's of enhancement mode, the MISFET's connected in series with the specific MISFET's of enhancement mode are selected to be of depletion mode. This easily done by a single mask for locally selectively forming the MISFET's of depletion mode.

The above and other objects, features and advantages of the present invention will become apparent from the following detailed description taken in conjunction with the accompanying drawings.

DESCRIPTION OF THE PREFERRED EMBODIMENTS

Figure 1:
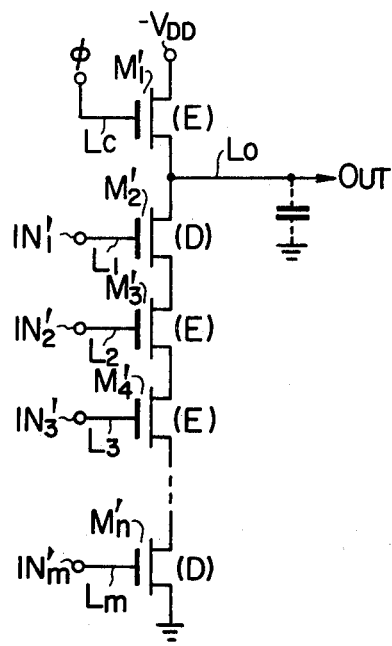
FIG. 1 is a basic circuit diagram of a publicly unknown ROM of the serial type previously proposed in the company to which the present inventor belongs.

FIG. 1 shows a basic structure of a ROM circuit of the serial type previously proposed in the company to which the present inventor belongs.

Referring to FIG. 1, the proposed ROM of the serial type comprises a plurality of P-channel MISFET's $M_3'$ and $M_4'$ of enhancement mode and a plurality of P-channel MISFET's $M_2'$ and $M_n'$ of depletion mode connected in series with each other across a single output line $L_o$ and a reference potential source (an earth line). Another MISFET $M_1'$ of enhancement mode is connected across the output line $L_o$ and a power supply $-V_{DD}$ in series with the MISFET $M_2'$ of depletion mode.

In the circuit shown in FIG. 1, the MISFET's $M_2'$ and $M_n'$ associated with respective address lines $L_1$ and $L_m$ are of depletion mode, and therefore, the state of an output signal OUT appearing on the output line $L_o$ is independent of input signals $IN_1'$ and $IN_m'$ applied to the respective address lines $L_1$ and $L_m$. In other words, the output signal OUT of this circuit responds solely to input signals $IN_2'$ and $IN_3'$ applied to address lines $L_2$ and $L_3$ connected respectively to the MISFET's $M_3'$ and $M_4'$ of enhancement mode.

It will thus be seen that, in the ROM of the serial type shown in FIG. 1, whether or not the output signal OUT responds to the input signal applied by a selected one of the address lines is determined by the mode of the MISFET connected to the selected address line, that is, the output signal responds to the input signal when the selected address line is connected to the MISFET of depletion mode. In other words, writing of information is carried out by the formation of the MISFET's of depletion mode. Such a ROM of large scale can be formed on a single substrate of silicon by, for example, the known IC making technique commonly used for the formation of MOSFET's having a silicon gate. In this case, an impurity of the same conductivity type as that used to form the source and drain regions is previously diffused or implanted in those portions of the semiconductor substrate corresponding to channel regions which constitute the MISFET's of depletion mode to be formed. Thus, a single mask pattern for forming the channel regions of FET's of depletion mode can be utilized for writing desired information.

In the ROM structure of the serial type, the MISFET's of depletion mode and those of enhancement mode are disposed in matrix form, and therefore, the necessity for provision of multi-layer wiring of aluminum is eliminated. Further, such multi-layer wiring is also unnecessary even in the area in which the source or drain regions cross the polycrystalline silicon layers providing the silicon gates. Further, the drain region of each individual MISFET can be formed for use in common to the source region of the adjacent MISFET's. Thus, a ROM of large scale having a high packing density can be obtained.

It may be frequently desired to combine a ROM of the lateral type having a relatively small capacity with such large-scale ROM of the serial type. The combination of the ROM of the serial type and that of the lateral type is desirable in that the degree of freedom of logical design can be increased to facilitate the logical design. The present invention contemplates the provision of a novel ROM of the lateral type having a unique structure as described below. In the ROM according to the present invention, information can be written by the use of a mask pattern of the same kind as that used for writing information in a ROM of the serial type by locally selectively forming MISFET's of depletion mode.

Figure 2:
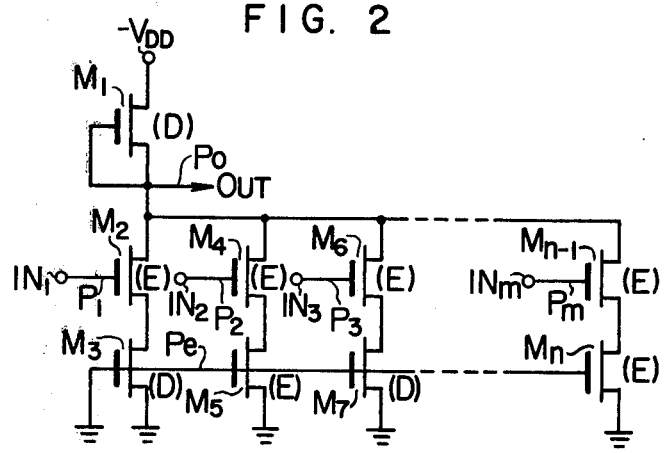
FIG. 2 is a basic circuit diagram of a ROM of the lateral type according to the present invention.

FIG. 2 shows a basic circuit of an embodiment of the ROM of the lateral type according to the present invention.

Referring to FIG. 2, a plurality of P-channel MISFET's $M_2$, $M_4$, $M_6$ and $M_{n-1}$ of enhancement mode constituting a first MISFET group are connected or arranged in parallel with one another between a single output line $P_o$ and a reference potential source (earth), and a plurality of P-channel MISFET's $M_3$, $M_5$, $M_7$ and $M_n$ of either depletion mode or enhancement mode constituting a second MISFET group are respectively connected in series with the MISFET's in the first MISFET group. For instance, the MISFET's $M_3$ and $M_7$ of depletion mode are respectively connected to the MISFET's $M_2$ and $M_6$ of enhancement mode, and the MISFET's $M_5$ and $M_n$ of enhancement mode are respectively connected to the MISFET's $M_4$ and $M_{n-1}$ of enhancement mode. The MISFET's in the second MISFET group are grounded at the gate thereof by an earth line $P_e$. Another MISFET $M_1$ of depletion mode is connected across the output line $P_o$ and a power source $-V_{DD}$ to act as a load. The gate of this MISFET $M_1$ is connected to the source thereof, and thus, this MISFET $M_1$ operates as a constant-current load. The symbols (E) and (D) are shown in FIG. 2 to indicate that the associated MISFET's are of enhancement mode and depletion mode respectively.

Input signals $IN_1$ to $IN_m$ are successively applied to corresponding address lines $P_1$ to $P_m$ respectively in the circuit shown in FIG. 2. In response to the application of the input signal $IN_1$ to the address line $P_1$, an output signal OUT at the earth level appears on the output line $P_o$ since the MISFET $M_3$ is of the depletion mode. In response to the application of the input signal $IN_2$ to the address line $P_2$, an output signal OUT at the power supply level appears on the output line $P_o$ since the MISFET $M_5$ is of the enhancement mode. Similarly, an output signal OUT at the earth level appears in response to the application of the input signal $IN_3$, and an output signal OUT at the power supply level appears in response to the application of the input signal $IN_m$.

In other words, in response to the application of the input signal $IN_1$ to the address line $P_1$, the output signal OUT appearing on the output line $P_o$ responds to this input signal $IN_1$ since the MISFET $M_3$ in the second MISFET group connected to the MISFET $M_2$ in the first MISFET group is of the depletion mode. However, due to the fact that the MISFET $M_5$ in the second MISFET group connected to the MISFET $M_4$ in the first MISFET group is of the enhancement mode, the MISFET $M_5$ is always kept turned off, and therefore, the series circuit of the MISFET's $M_4$ and $M_5$ is continuously kept in the off state. Thus, the output signal OUT appearing on the output line $P_o$ is independent of the input signal $IN_2$ applied to the address line $P_2$. Similarly, the output signal OUT responds to the input signal $IN_3$ applied to the address line $P_3$ and does not respond to the input signal $IN_m$ applied to the address line $P_m$.

It will thus be understood that the output signal OUT appearing on the output line $P_o$ responds only to the input signals $IN_1$ and $IN_3$ applied respectively to the address lines $P_1$ and $P_3$. In this manner, information is written in the ROM by selectively determining the mode of some of MISFET's in the second MISFET group connected respectively in series with the associated ones of enhancement mode in the first MISFET group to be of depletion mode. A user of this ROM may demand that the output signal OUT appearing on the output line $P_o$ should also respond to the input signals $IN_2$ and $IN_m$ applied respectively to the address lines $P_2$ and $P_m$. Such demand can be easily met by replacing the MISFET's $M_5$ and $M_n$ of enhancement mode by those of depletion mode.

FIG. 2 shows, by way of example, one basic circuit form of the ROM of the present invention in which different one of the MISFET's in the first MISFET group is solely connected to each address line, and all the MISFET's in the first MISFET group are connected in common to the MISFET which acts as a load, so that one output signal can be derived from the circuit. However, the ROM may include a plurality of basic circuits each of which is as shown in FIG. 2, and the MISFET's corresponding to the first MISFET group in such circuits may be connected to the individual address lines so that a plurality of output signals including the one shown in FIG. 2 can be derived.

It will thus be understood that desired information can be written in the ROM by locally selectively providing MISFET's of depletion mode in the second MISFET group. Selective provision of the MISFET's of depletion mode in the second MISFET group can be achieved by suitably modifying the pattern of a single mask used for the manufacture of the ROM according to the known IC making technique.

Figure 3:
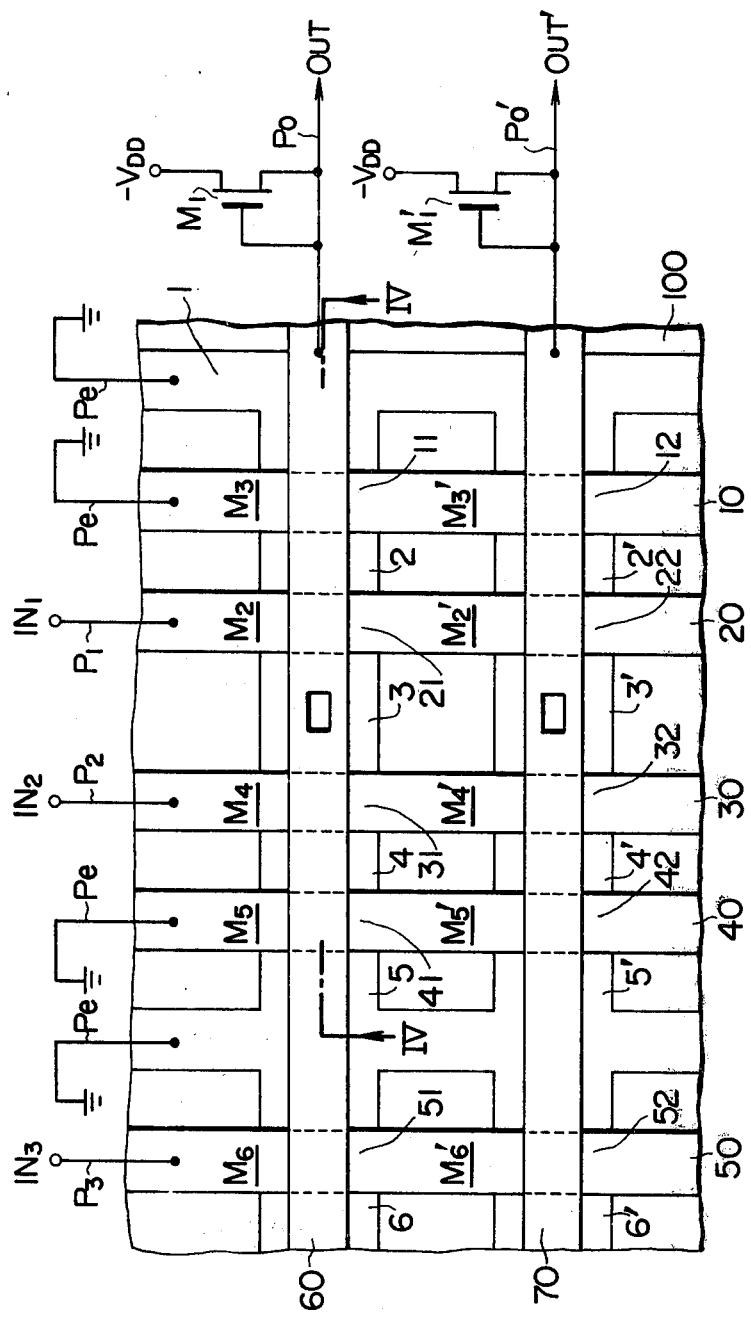
FIG. 3 is a plan view of a semiconductor substrate showing schematically how the ROM of FIG. 2 is manufactured in an integrated circuit form.

FIG. 3 is a schematic plan view of a semiconductor substrate of silicon when a plurality of circuits each as shown in FIG. 2 are formed on the substrate by the IC making technique. FIG. 4e is a schematic sectional view of the integrated circuit shown in FIG. 3 when the section is taken along the line IV—IV in FIG. 3.

Referring to FIGS. 3 and 4e, P-type diffused regions 1 to 5 and 2' to 6' are formed in a monocrystalline substrate 100 of N-type silicon and are self-aligned by gates 11, 21, 31, 41, 51, 12, 22, 32, 42 and 52 of polycrystalline silicon. Each of these diffused regions provides the source or drain of the corresponding MISFET. The polycrystalline silicon gates 11, 21, 31, 41, 51, 12, 22, 32, 42 and 52 are formed on gate insulating films 102 of silicon dioxide having substantially the same thickness of, for example, 1,000 A. P-type impurity ions are selectively implanted in the surface portion of the substrate 100 to form a P-type channel region 104 for providing the MISFET $M_3$ of depletion mode. A field insulating film 101 of silicon dioxide having a relatively large thickness of the order of 1 to 2 $\mu$ covers the surface of the P-type diffused regions and covers also the entire surface of the substrate 100 except the surface portions covered by the gate insulating films 102. Layers 60 and 70 of aluminum are deposited on the substrate surface to provide output lines $P_o$ and $P_o'$ respectively. Layers 20, 30 and 50 of polycrystalline silicon are deposited on the substrate surface to provide address lines $P_1$, $P_2$ and $P_3$ respectively. Layers 10 and 40 of polycrystalline silicon are deposited on the substrate surface to provide earth lines $P_e$ respectively. These wiring layers of polycrystalline silicon are connected in common to the gates of polycrystalline silicon formed on the thin gate insulating films.

It will be apparent from FIGS. 3 and 4e that one memory cell is necessarily formed in each of the areas where the P-type diffused regions are crossed by the wiring layers 10, 20, 30, 40 and 50 of polycrystalline silicon providing the address and earth lines. The state of each individual memory cell or MISFET is determined by the presence or absence of the P-type channel region formed by implanting the P-type impurity ions.

The process for the manufacture of the ROM of the present invention will now be described with reference to FIGS. 4a to 4e.

Figure 4A:
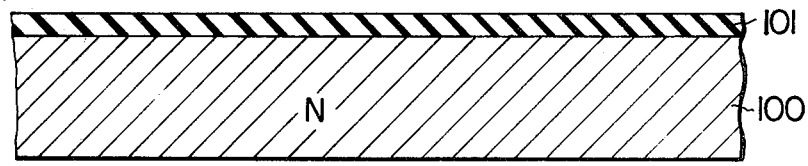
FIGS. 4a to 4e are schematic sectional views of the integrated circuit shown in FIG. 3 to illustrate successive steps of the manufacturing process.
Figure 4B:
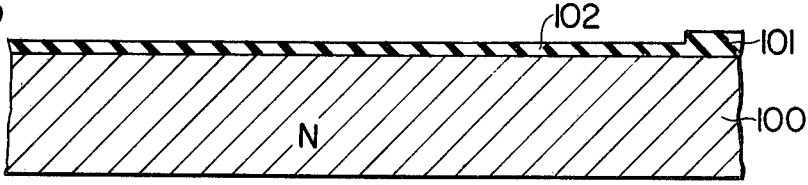
Figure 4C:
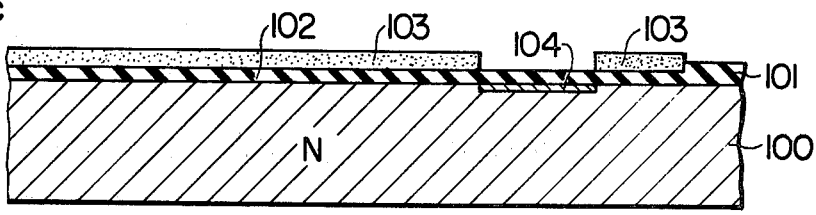
Figure 4D:
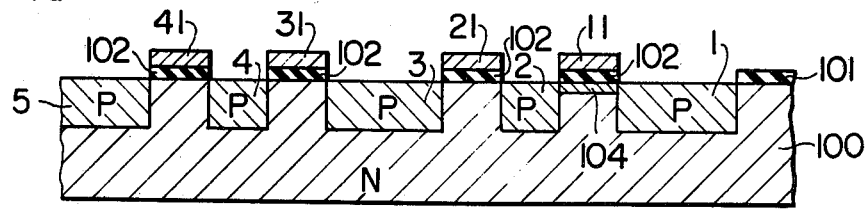
Figure 4E:
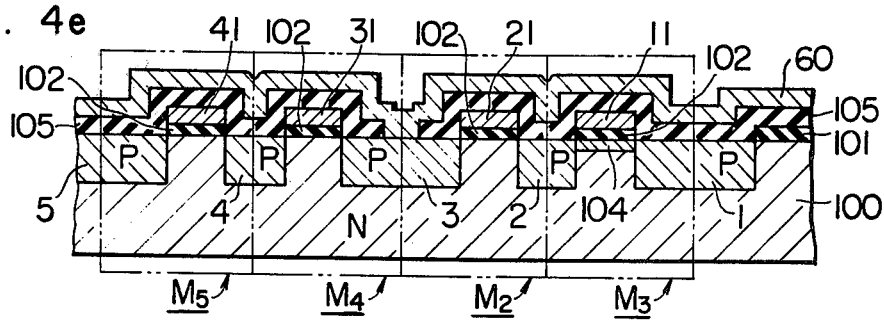

A film 101 of $SiO_2$ about 1.4 $\mu$ thick is formed on the surface of a monocrystalline substrate 100 of N-type silicon having a resistivity of 5 to 8 $\Omega$cm, as shown in FIG. 4a. Then, the $SiO_2$ film 101 covering the substrate surface is locally removed in narrow channel form in an area where the MISFET's are to be formed, and the exposed surface area of the substrate 100 is oxidized to form a thin film 102 of $SiO_2$ about 1,200 A thick on such surface area, as shown in FIG. 4b. Ion borons having an ion concentration of about $1.4 \times 10^{11}$ atoms/cm$^2$ are then implanted in the surface of the substrate 100 through the thin $SiO_2$ film 102. A layer 103 of photoresist material is then applied on the portions of the thin $SiO_2$ film 102 where the MISFET's of depletion mode are not to be formed. Boron ions having an ion concentration of about $6.5 \times 10^{11}$ atoms/cm$^2$ is implanted in the substrate surface through the exposed thin $SiO_2$ film portion using the photoresist layer 103 and thick $SiO_2$ film 101 as a mask, thereby forming a P-type region 104 as shown in FIG. 4c. The P-type region 104 thus formed provides the channel of the MISFET of depletion mode. The photoresist layer 103 is then removed, and a layer of polycrystalline silicon about 5,000 A thick is deposited on the entire $SiO_2$ films. Subsequently, the polycrystalline silicon layer is removed except the portions where the address lines 11, 21, 31 and 41 are to be formed. The thin $SiO_2$ film 102 is then locally removed to expose the corresponding portions of the substrate surface using the remaining portions of the polycrystalline silicon layer corresponding to the address lines 11, 21, 31 and 41 as a mask. Then, the thick $SiO_2$ film 101 and the remaining portions of the polycrystalline silicon layer corresponding to the address lines 11, 21, 31 and 41 are used as a mask for diffusing boron into the exposed surface portions of the substrate 100 by the known method of impurity diffusion from a vapor phase, thereby forming P-type diffused regions 1, 2, 3, 4 and 5 about 0.8 $\mu$ thick as shown in FIG. 4d. Subsequently, a film 105 of phosphosilicate glass (PSG) about 0.9 to 1.0 $\mu$ thick is deposited from a vapor phase thereby forming an MIS ROM as shown in FIG. 4e. Thus, the MIS matrix according to the present invention can be obtained which comprises the combination of the MISFET's of enhancement mode and depletion mode having the gate insulating films of substantially the same thickness.

It will be apparent from the above description that, in the MIS matrix according to the present invention, the address lines of polycrystalline silicon extend substantially normal to the individual P-type diffused regions, and all the gate insulating films underlying the address lines of polycrystalline silicon have the same thickness of about 1,200 A, so that the transistor operation can be reliably carried out. Any desired one or ones of these transistors can be selectively formed to be of the depletion mode by suitably determining the pattern of the mask 103 used for the implanting of the boron ions in the step shown in FIG. 4c. Thus, the MISFET of depletion mode can be formed without requiring any especial technique which may be required in addition to the known technique of making an integrated circuit. For example, this MISFET of depletion mode is formed in the step of forming another MISFET of depletion mode, for example, an inverter, during the integration of the circuit shown in FIG. 2 on a single semiconductor substrate.

According to the present invention, the arrangement of MISFET's of enhancement mode and depletion mode in a read-only memory of small capacity is determined by a mask. Therefore, the present invention is advantageous in that the cost required for information writing can be reduced due to the fact that the same mask as that used for writing information in a serial type ratioless read-only memory can be used for writing information in the small-capacity read-only memory of the lateral type.

The small-capacity read-only memory according to the present invention is of the ratio structure as apparent from the above description. Therefore, a flip-flop circuit for receiving the output of the memory is unnecessary, and no time lag occurs. Further, when no input signal is applied to anyone of the MISFET's of enhancement mode, the MISFET's connected to the input lines are turned off. Therefore, no dc current flows from the power supply terminal to the earth terminal, and wasteful power consumption can be avoided.

Figures 5A, 5B:
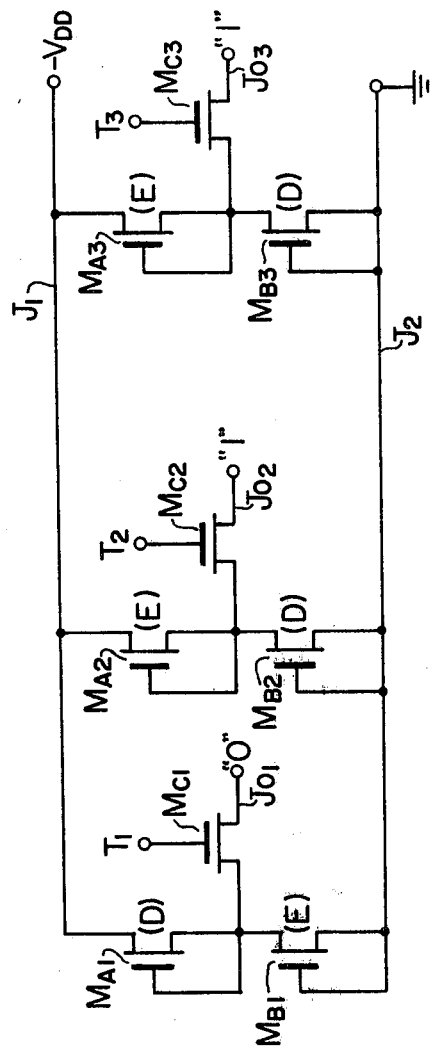
FIGS. 5a and 5b are basic circuit diagrams of another embodiment of the present invention.

The present invention is in no way limited to the specific embodiment above described and may have a structure as shown in FIG. 5a.

Referring to FIG. 5a, a pair of MISFET's $M_A$ and $M_B$ are connected in series with each other across a power supply terminal and an earth terminal, and one of these MISFET's $M_A$ and $M_B$ is selected to be of depletion mode. Thus, when, for example, the MISFET $M_A$ is of depletion mode, an output signal OUT at the power supply level appears at an output line $J_o$, while when the MISFET $M_B$ is of depletion mode, an output signal OUT at the earth level appears at the output line $J_o$. A timing pulse signal T is applied to another MISFET $M_C$ so that the output signal OUT can appear at the output line $J_o$ with predetermined timing.

FIG. 5b shows a ROM in which a plurality of basic circuits each as shown in FIG. 5a are combined together for writing desired information. The ROM shown in FIG. 5b comprises MISFET's $M_{A1}$, $M_{B2}$ and $M_{B3}$ of depletion mode and MISFET's $M_{B1}$, $M_{A2}$ and $M_{A3}$ of enhancement mode. Thus, "0," "1" and "1" appear on respective output lines $J_{o1}$, $J_{o2}$ and $J_{o3}$ during operation of the ROM according to the positive logic. The MISFET's $M_{A3}$ and $M_{B3}$ may be respectively replaced by those of depletion mode and enhancement mode when it is desired to obtain "0" on the output line $J_{o3}$. The circuit shown in FIG. 5b can operate with remarkably reduced power consumption since no dc current flows from the power supply terminal to the earth terminal.

I claim:

1. A read-only memory comprising:
   a first and a second line;
   a plurality of information memory circuits connected in parallel with one another across said first and second lines, each said memory circuit comprising a pair of insulated-gate field effect transistors connected in series with each other across said first and second lines, one of said insulated-gate field effect transistors in each said information memory circuit in which information is to be written being of depletion mode, while the other said insulated-gate field effect transistor being of enhancement mode;
   means for supplying electric power to said information memory circuits; and
   means for reading out the information written in said information memory circuits.

2. A read-only memory as claimed in claim 1, wherein said reading means comprises a load means connected at one terminal thereof to said first line and is connected in series with all said information memory circuits, and said electric power is supplied to said information memory circuits through said load means, whereby the information written in said information memory circuits is read out to appear on said first line.

3. A read-only memory as claimed in claim 2, wherein said load means comprises an insulated-gate field effect transistor of depletion mode having its gate connected to its source.

4. A read-only memory as claimed in claim 2, wherein said insulated-gate field effect transistors of enhancement mode in said information memory circuits are respectively connected at the gate thereof to associated address lines, whereby said information memory circuits from which the information is to be read out are selected by control signals applied to said address lines.

5. A read-only memory as claimed in claim 1, wherein said reading means comprises a switching means connected at one terminal thereof to the connection point of said two series-connected insulated-gate field effect transistors constituting each said information memory circuit, whereby the information written in said information memory circuits is read out through said switching means to appear at the other terminal of said switching means.

6. A read-only memory as claimed in claim 5, wherein said switching means comprises an insulated-gate field effect transistor of enhancement mode.

7. A read-only memory comprising:
   a line for deriving an output signal of the memory;
   a second and a third line for supplying electric power;
   a plurality of address lines for applying address signals;
   a plurality of information memory circuits associated with the corresponding ones of said address lines and connected in parallel with one another across said first and second lines, each said information memory circuit including a series connection of a first insulated-gate field effect transistor of enhancement mode connected at the gate thereof to one of said address lines and a second insulated-gate field effect transistor having the gate and source thereof connected to each other and having the operating mode thereof selected to be of either one of enhancement mode and depletion mode depending on the information to be stored; and
   a third insulated-gate field effect transistor connected across said first and third lines to function as a load for said information memory circuits;
   whereby the information stored in said information memory circuits is read out to appear as an output signal on said first line in response to the application of the address signals to said address lines.

8. A read-only memory comprising:
a first line;
a second line;
a plurality of information memory circuits connected in parallel with one another across said first and second lines, each memory circuit storing prescribed information therein to be non-destructively read-out when selectively addressed, each memory circuit comprising a series connection of a first field effect of the enhancement type and means for defining the information stored in the memory circuit, said defining means being formed of a second field effect transistor of one of the enhancement and depletion type, which one type effectively defines the information stored in the memory circuit;

means for supplying electric power to said information memory circuits; and means, coupled to each of said memory circuits, for selectively addressing each respective circuit and thereby causing the information stored therein to be non-destructively read-out.

* * * * *